(12) United States Patent
Kuo et al.

(10) Patent No.: US 9,728,238 B2
(45) Date of Patent: Aug. 8, 2017

(54) SPIN TRANSFER TORQUE MEMORY (STTM) DEVICE WITH HALF-METAL AND METHOD TO WRITE AND READ THE DEVICE

(75) Inventors: Charles C. Kuo, Hillsboro, OR (US); Roksana Golizadeh Mojarad, San Jose, CA (US); Brian S. Doyle, Portland, OR (US); David L. Kencke, Beaverton, OR (US); Kaan Oguz, Dublin (IE); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/996,500

(22) PCT Filed: Dec. 19, 2011

(86) PCT No.: PCT/US2011/065882
§ 371 (c)(1),
(2), (4) Date: Jun. 20, 2013

(87) PCT Pub. No.: WO2013/095336
PCT Pub. Date: Jun. 27, 2013

(65) Prior Publication Data
US 2013/0336045 A1 Dec. 19, 2013

(51) Int. Cl.
*G11C 11/16* (2006.01)
*H01L 43/08* (2006.01)
(Continued)

(52) U.S. Cl.
CPC ........ *G11C 11/161* (2013.01); *G11C 11/1673* (2013.01); *H01L 29/82* (2013.01);
(Continued)

(58) Field of Classification Search
None
See application file for complete search history.

(56) References Cited

U.S. PATENT DOCUMENTS 5,793,279 A * 8/1998 Nepela .................. B82Y 10/00
257/E43.005
6,958,927 B1 10/2005 Nguyen et al.
(Continued)

FOREIGN PATENT DOCUMENTS

CN 1649028 8/2005
FR WO 2010136527 A1 * 12/2010 ............. B82Y 25/00

OTHER PUBLICATIONS

Kumar, K., Kumar, N., Markandeyulu, G., Chelvane, J., Neu, V., Babu, P., J. Mag. Mag. Mat., 320, 2008, 2737-2740.*
(Continued)

*Primary Examiner* — Kevin Bernatz
(74) *Attorney, Agent, or Firm* — Blakely, Sokoloff, Taylor & Zafman LLP

(57) ABSTRACT

Spin transfer torque memory (STTM) devices with half-metals and methods to write and read the devices are described. For example, a magnetic tunneling junction includes a free magnetic layer, a fixed magnetic layer, and a dielectric layer disposed between the free magnetic layer and the fixed magnetic layer. One or both of the free magnetic layer and the fixed magnetic layer includes a half-metal material at an interface with the dielectric layer.

23 Claims, 6 Drawing Sheets

(51) Int. Cl.
*H01L 43/10* (2006.01)
*H01L 29/82* (2006.01)
*H01L 43/02* (2006.01)
*H01L 27/22* (2006.01)

(52) U.S. Cl.
CPC .............. *H01L 43/02* (2013.01); *H01L 43/08* (2013.01); *H01L 43/10* (2013.01); *H01L 27/228* (2013.01)

(56) References Cited

U.S. PATENT DOCUMENTS

| | | | |
|---|---|---|---|
| 6,977,801 B2 * | 12/2005 | Carey | B82Y 10/00 257/E43.005 |
| 7,190,611 B2 | 3/2007 | Nguyen et al. | |
| 2004/0130936 A1 | 7/2004 | Nguyen et al. | |
| 2005/0168882 A1 * | 8/2005 | Kim et al. | 360/324.1 |
| 2007/0074317 A1 | 3/2007 | Pakala et al. | |
| 2007/0297103 A1 | 12/2007 | Zhang et al. | |
| 2009/0015969 A1 * | 1/2009 | Kainuma et al. | 360/314 |
| 2009/0097168 A1 * | 4/2009 | Inomata et al. | 360/324.1 |
| 2009/0168269 A1 * | 7/2009 | Carey | B82Y 25/00 360/324.11 |
| 2009/0257151 A1 * | 10/2009 | Zhang et al. | 360/324.2 |
| 2010/0103565 A1 * | 4/2010 | Lou | B82Y 25/00 360/324.11 |
| 2010/0188771 A1 * | 7/2010 | Okamura | B82Y 10/00 360/75 |
| 2011/0007560 A1 * | 1/2011 | Dieny | B82Y 25/00 365/171 |
| 2012/0068139 A1 * | 3/2012 | Daibou et al. | 257/2 |
| 2012/0112299 A1 * | 5/2012 | Inomata et al. | 257/421 |
| 2012/0153412 A1 | 6/2012 | Doyle et al. | |

OTHER PUBLICATIONS

Abstract of WO 2010/236527 A1 (published 2010).*
Hashimoto et al. (App. Phys. Let., 87, 102506, 2005).*
International Search Report and Written Opinion for PCT Patent Application No. PCT/US2011/065882 Mailed Oct. 12, 2012, 12 Pages.
International Preliminary Report on Patentability from PCT/US2011/065882 mailed Jul. 3, 2014, 8 pgs.
Office Action and Search Report from Taiwanese Patent No. 01142604 mailed Jan. 7, 2015, 1 pgs.
Xu, Wei, et al., "Design of Last-Level On-Chip Cache Using Spin-Torque Transfer RAM (STT RAM)," Very Large Scale Integration (VLSI) Systems, vol. 19, No. 3, Mar. 2011, pp. 483-493.

* cited by examiner

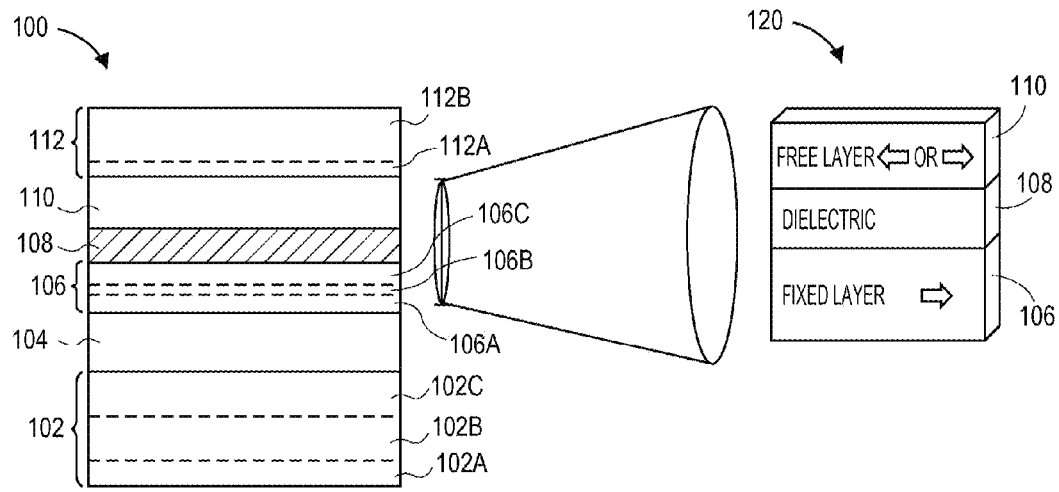
FIG. 1
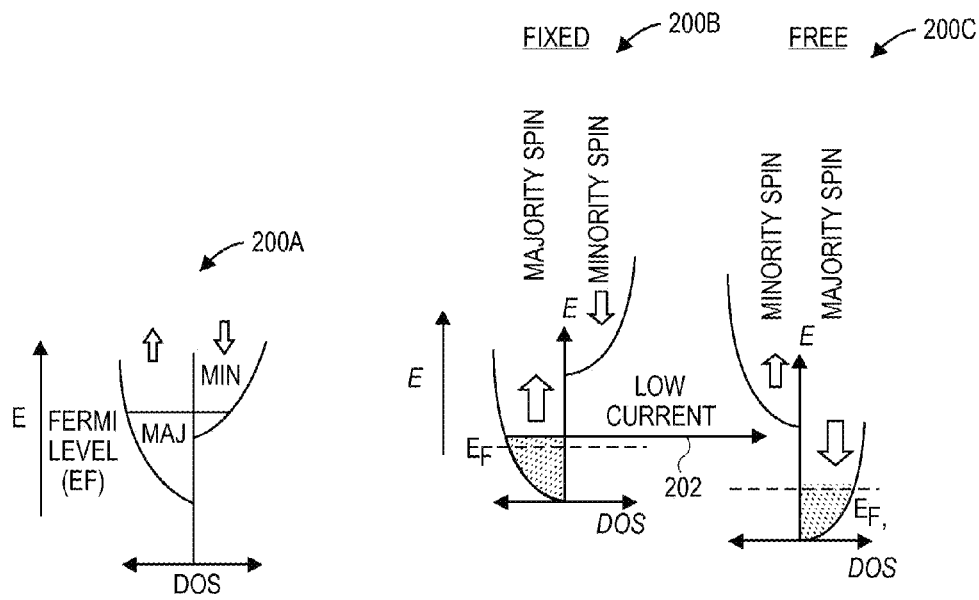
FIG. 2A  FIG. 2B

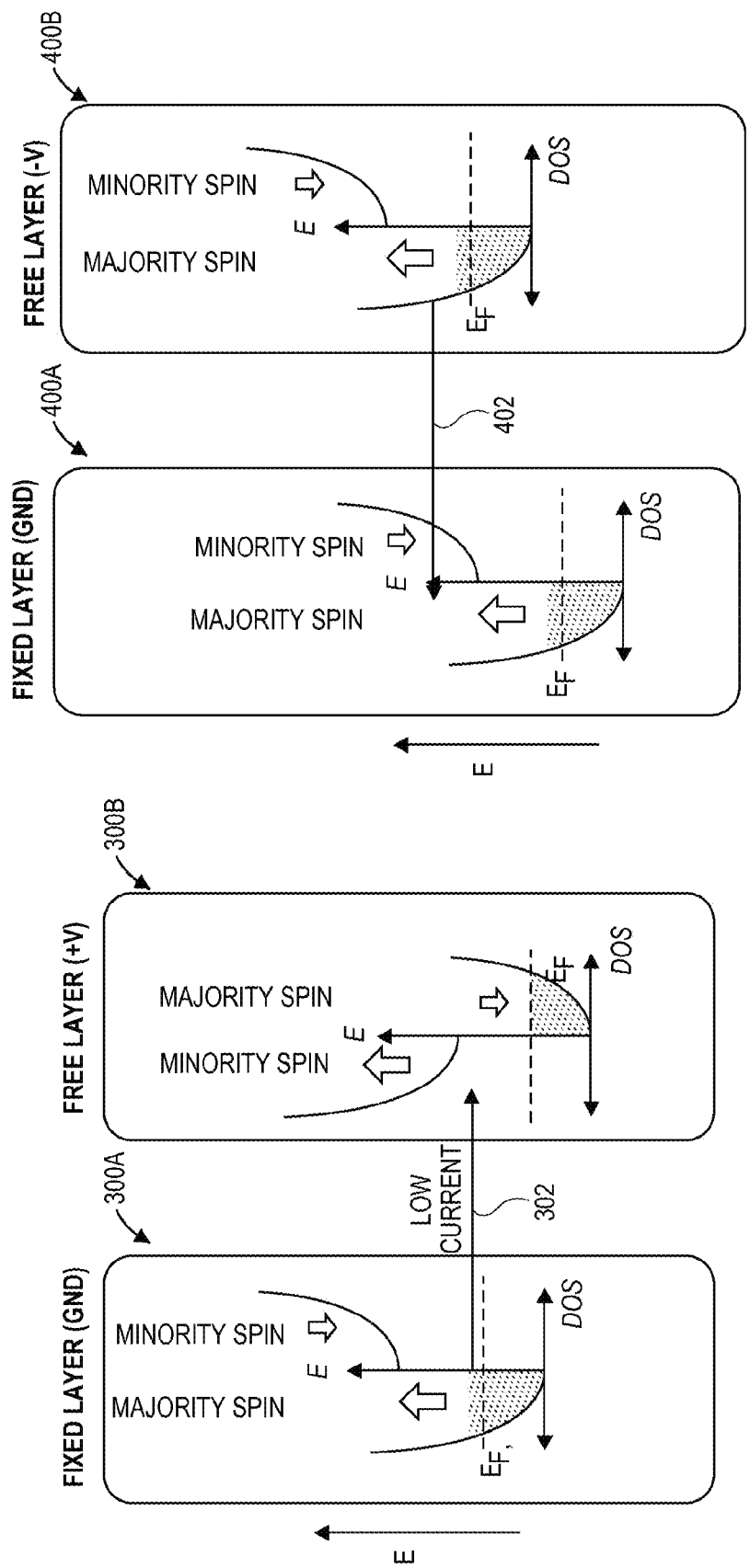

SPIN TRANSFER TORQUE MEMORY (STTM) DEVICE WITH HALF-METAL AND METHOD TO WRITE AND READ THE DEVICE

CLAIM OF PRIORITY

This application is a U.S. National Phase application under 35 U.S.C. §371 of International Application No. PCT/US2011/065882, filed Dec. 19, 2011, entitled "SPIN TRANSFER TORQUE MEMORY (STTM) DEVICE WITH HALF-METAL AND METHOD TO WRITE AND READ THE DEVICE," the entire contents of which are incorporated herein by reference.

TECHNICAL FIELD

Embodiments of the invention are in the field of memory devices and, in particular, spin transfer torque memory (STTM) devices with half-metals and methods to write and read the devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The operation of spin torque devices is based on the phenomenon of spin transfer torque. If a current is passed through a magnetization layer, called the fixed magnetic layer, it will come out spin polarized. With the passing of each electron, its spin (which is angular momentum of the electron) will be added to the magnetization in a next magnetic layer, called the free magnetic layer, and will cause its small change. This is, in effect, a torque-causing precession of magnetization. Due to reflection of electrons, a torque is also exerted on the magnetization of an associated fixed magnetic layer. In the end, if the current exceeds a certain critical value (given by damping caused by the magnetic material and its environment), the magnetization of the free magnetic layer will be switched by a pulse of current, typically in about 1 nanosecond. Magnetization of the fixed magnetic layer may remain unchanged since an associated current is below its threshold due to geometry or due to an adjacent anti-ferromagnetic layer.

Spin-transfer torque can be used to flip the active elements in magnetic random access memory. Spin-transfer torque memory, or STTM, has the advantages of lower power consumption and better scalability over conventional magnetic random access memory (MRAM) which uses magnetic fields to flip the active elements. However, significant improvements are still needed in the area of STTM device manufacture and usage.

SUMMARY

Embodiments of the present invention include spin transfer torque memory (STTM) devices with half-metals and methods to write and read the devices.

In an embodiment, a magnetic tunneling junction includes a free magnetic layer, a fixed magnetic layer, and a dielectric layer disposed between the free magnetic layer and the fixed magnetic layer. One or both of the free magnetic layer and the fixed magnetic layer includes a half-metal material at an interface with the dielectric layer.

In another embodiment, a non-volatile memory device includes a first electrode and a fixed magnetic layer disposed above the first electrode. A free magnetic layer is disposed above the fixed magnetic layer, and a second electrode is disposed above the free magnetic layer. A dielectric layer is disposed between the free magnetic layer and the fixed magnetic layer. One or both of the free magnetic layer and the fixed magnetic layer includes a half-metal material at an interface with the dielectric layer. The non-volatile memory device also includes a transistor electrically connected to the first or the second electrode, a source line, and a word line.

In another embodiment, a method of reading a non-volatile memory device includes grounding a first electrode having disposed there above a fixed magnetic layer, a free magnetic layer disposed above the fixed magnetic layer, and a dielectric layer disposed between the free magnetic layer and the fixed magnetic layer. The fixed magnetic layer includes a half-metal material at the interface with the dielectric layer. The method further includes negatively biasing a second electrode disposed above the free magnetic layer. The resistance of a current that passes through the free magnetic layer, the dielectric layer, and the fixed magnetic layer upon negatively biasing the second electrode is then measured.

BRIEF DESCRIPTION OF THE DRAWINGS

FIG. 1 illustrates a cross-sectional view of a material layer stack for a spin transfer torque memory (STTM) device, with an expanded view of three layers of a magnetic tunneling junction (MTJ) of the STTM device, in accordance with an embodiment of the present invention.

FIG. 2A illustrates a plot of energy (E) as a function of density of states (DOS) for a magnetic layer not including a half-metal material.

FIG. 2B illustrates plots of energy (E) as a function of density of states (DOS) for a fixed magnetic layer including a half-metal material and for a free magnetic layer including a half-metal material, respectively, and a reading operation of an MTJ including the layers, in accordance with an embodiment of the present invention.

FIG. 3 illustrates plots of energy (E) as a function of density of states (DOS) for a fixed magnetic layer including a half-metal material and for a free magnetic layer including a half-metal material, respectively, and a writing operation of an MTJ including the layers, in accordance with an embodiment of the present invention.

FIG. 4 illustrates plots of energy (E) as a function of density of states (DOS) for a fixed magnetic layer including a half-metal material and for a free magnetic layer including a half-metal material, respectively, and a switching operation of an MTJ including the layers, in accordance with an embodiment of the present invention.

DETAILED DESCRIPTION

Figure 6:
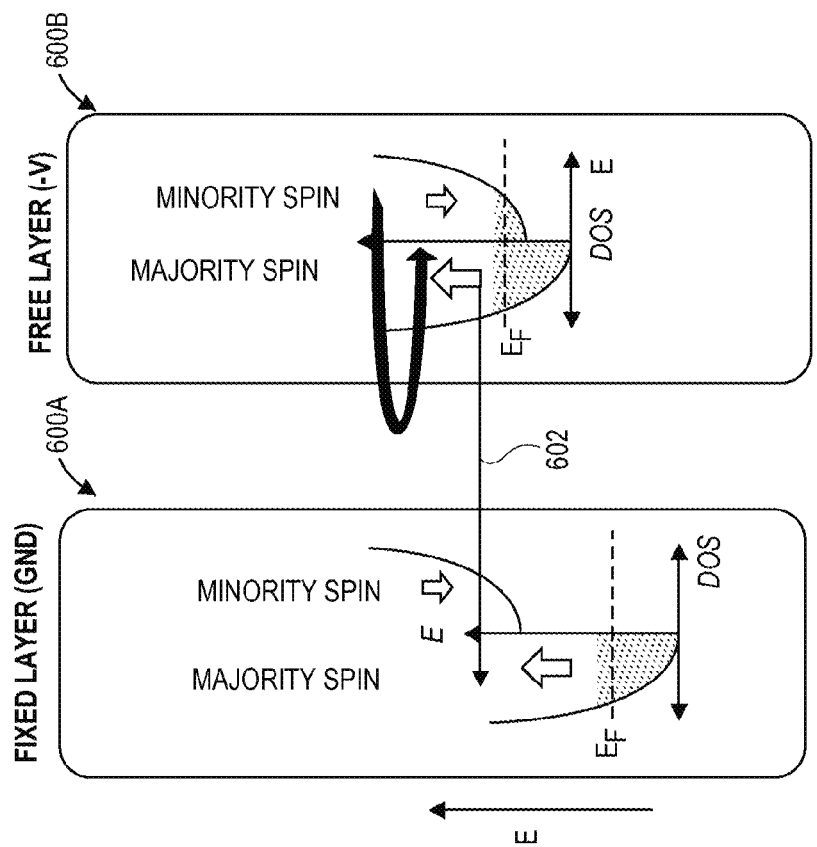
FIG. 6 illustrates plots of energy (E) as a function of density of states (DOS) for a fixed magnetic layer including a half-metal material and for a free magnetic layer including only conventional ferromagnetic material, respectively, and a writing operation of an MTJ including the layers, in accordance with an embodiment of the present invention.

Spin transfer torque memory (STTM) devices with half-metals and methods to write and read the devices are described. In the following description, numerous specific details are set forth, such as specific magnetic layer integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed at spin transfer torque embedded memory. One or more material layers incorporating a half metal Heusler ferromagnet may be included in such a memory device. Methods to write and read half-metals in devices using spin transfer torque are also described. For example, half-metals (e.g. Heusler alloys) may be included to increase the difference between anti-parallel resistance (RAP) and parallel resistance (RP) (i.e. ΔR) in magnetic tunneling junction (MTJ) devices. However, writing by current may be difficult in nano-scale MTJ devices using such half metals. One or more embodiments described herein include methods to accommodate writing such devices while maintaining the ability to benefit from large ΔR in half metal systems.

In a specific embodiment, MTJ devices include a half-metal at a fixed magnetic layer and dielectric interface. A conventional ferromagnet may be included at a free magnetic layer and the dielectric interface. Thus, a device may include a conventional ferromagnet layer in the free magnetic layer and a half metal in the fixed magnetic layer. The device may be read under −V, such that electrons move from conventional ferromagnetic material to half-metal-based material. Such an approach may solve issues of current induced switching for MTJ stacks using half-metals. Reading may be performed under −V, such that electrons move from free magnetic layer into fixed magnetic layer. In another specific embodiment, however, MTJ devices include a half-metal at a free magnetic layer and dielectric interface, or at both dielectric interfaces.

In an aspect, a half-metal layer may be included in an MTJ, e.g., for use in a memory device. For example, FIG. 1 illustrates a cross-sectional view of a material layer stack for a STTM device, with an expanded view of three layers of an MTJ of the STTM device, in accordance with an embodiment of the present invention.

Referring to FIG. 1, a material layer stack 100 for a STTM device includes a bottom electrode 102, an anti-ferromagnetic layer 104, a fixed magnetic layer 106, a dielectric layer 108, a free magnetic layer 110, and a top electrode 112. As shown on the right-hand side of FIG. 1, an MTJ portion 120 of the material layer stack 100 includes the fixed magnetic layer 106, the dielectric layer 108, and the free magnetic layer 110.

In an embodiment, the bottom electrode 102 is composed of a material or stack of materials suitable for electrically contacting the fixed magnetic layer side of a STTM device. In one embodiment, the bottom electrode 102 is composed of a tantalum (Ta) layer 102A, ruthenium (Ru) layer 102B, tantalum (Ta) layer 102C stack, as depicted in FIG. 1.

In an embodiment, the anti-ferromagnetic layer 104 is composed of a material suitable to facilitate locking of the spins in an adjacent fixed magnetic layer, such as fixed magnetic layer 106. In one embodiment, the anti-ferromagnetic layer 104 is composed of a material such as, but not limited to, iridium manganese (IrMn) or platinum manganese (PtMn).

In an embodiment, the fixed magnetic layer 106 is composed of a material or stack of materials suitable for maintaining a fixed majority spin. Thus, the fixed magnetic layer 106 (or reference layer) may be referred to as a ferromagnetic layer. In one embodiment, the fixed magnetic layer 106 is composed of a single layer of cobalt iron boride (CoFeB). However, in another embodiment, the fixed magnetic layer 106 is composed of a cobalt iron boride (CoFeB) layer 106A, ruthenium (Ru) layer 106B, cobalt iron boride (CoFeB) layer 106C stack, as depicted in FIG. 1.

In an embodiment, the dielectric layer 108 is composed of a material suitable for allowing current of a majority spin to pass through the layer, while impeding at least to some extent current of a minority spin to pass through the layer. Thus, the dielectric layer 108 (or spin filter layer) may be referred to as a tunneling layer. In one embodiment, the dielectric layer 106 is composed of a material such as, but not limited to, magnesium oxide (MgO) or aluminum oxide ($Al_2O_3$).

In an embodiment, the free magnetic layer 110 is composed of a material suitable for transitioning between a majority spin and a minority spin, depending on the application. Thus, the free magnetic layer 110 (or memory layer) may be referred to as a ferromagnetic memory layer. In one embodiment, the free magnetic layer 110 is composed of a layer of cobalt iron boride (CoFeB).

In an embodiment, the top electrode 112 is composed of a material or stack of materials suitable for electrically contacting the free magnetic layer side of a STTM device. In one embodiment, the top electrode 112 is composed of a ruthenium (Ru) layer 112A, contact metal layer 112B stack, as depicted in FIG. 1. The ruthenium layer 112A may be included to prevent oxygen migration into the free magnetic layer 110. The metal contact layer may provide a low resistance path for conduction of current, and may be composed of material such as, but not limited to, copper, aluminum, nickel, and cobalt.

In accordance with an embodiment of the present invention, one of the fixed magnetic layer 106, the free magnetic layer 110, or both, includes a half-metal material layer. In a first example, in one embodiment, a half-metal material layer is included at the fixed magnetic layer 106 and dielectric layer 108 interface. In a specific such embodiment, the fixed magnetic layer 106 is a single layer composed of the half-metal material. However, in another specific embodiment, only a portion of the fixed magnetic layer 106 is composed of the half-metal material, e.g., in place of the cobalt iron boride (CoFeB) layer 106C described above. In a second example, in another embodiment, a half-metal material layer is included at the free magnetic layer 110 and dielectric layer 108 interface. In a specific such embodiment, the free magnetic layer 110 is a single layer composed of the half-metal material. However, in another specific embodiment, only a portion of the free magnetic layer 110 is composed of the half-metal material, e.g., as a sub-layer at the interface with the dielectric layer 108. In a third example, in yet another embodiment, a first half-metal material layer is included at the fixed magnetic layer 106 and dielectric layer 108 interface and a second half-metal material layer is included at the free magnetic layer 110 and dielectric layer 108 interface.

A variety of strategic locations may be selected from a half-metal material in a magnetic tunneling junction. For example, in one embodiment, the fixed magnetic layer is a combination of a thin half-metal (e.g., at the interface of a MgO dielectric and the fixed magnetic layer) and a conventional ferromagnetic material (e.g., with polarization less than 1) adjacent to the half-metal. In another embodiment, the free magnetic layer is composed of a combination of a conventional ferromagnetic material (e.g., with polarization less than 1) at e.g., the interface of a MgO dielectric and the free magnetic layer and an adjacent half-metal material. In an embodiment, as described in more detail below, a half-metal and dielectric (e.g., MgO) interface is situated on the fixed magnetic layer end, while the interface with MgO and the conventional ferromagnetic material is situated on the free magnetic layer end. The conventional ferromagnetic material may be a material as described above, e.g., CoFeB. The targeted location of a half-metal material relative to a conventional ferromagnetic material may be selected, in an embodiment, based on the description of FIGS. 2B-7, below.

In an embodiment, the half-metal material layers described above are referred to as a Heusler alloy, which is a ferromagnetic metal alloy based on a Heusler phase. Heusler phases may be intermetallics with particular composition and face-centered cubic crystal structure. The materials are ferromagnetic, even though the constituting elements are not, as a result of the double-exchange mechanism between neighboring magnetic ions. The materials usually include manganese ions, which sit at the body centers of the cubic structure and carry most of the magnetic moment of the alloy. In a specific embodiment, the half-metal material layer included in either the fixed magnetic layer 106, the free magnetic layer 110, or both, are material layers such as, but not limited to, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_3Si$, $Fe_2Val$, $Mn_2VGa$, or $Co_2FeGe$.

Thus, a magnetic tunneling junction may include a free magnetic layer, a fixed magnetic layer, and a dielectric layer disposed between the free magnetic layer and the fixed magnetic layer. One or both of the free magnetic layer and the fixed magnetic layer includes a half-metal material at an interface with the dielectric layer. In one embodiment, only the fixed magnetic layer includes a half-metal material at the interface with the dielectric layer. In a specific such embodiment, the fixed magnetic layer further includes a ferroelectric material adjacent the half-metal material, distal from the interface of the fixed magnetic layer with the dielectric layer. In another specific such embodiment, the free magnetic layer includes a ferroelectric material. In a particular such embodiment, the free magnetic layer further includes a half-metal material adjacent the ferroelectric material, distal from the interface of the free magnetic layer with the dielectric layer. In an embodiment, the magnetic tunneling junction further includes an anti-ferromagnetic layer adjacent the fixed magnetic layer, distal from the interface of the fixed magnetic layer with the dielectric layer.

In an embodiment, as described in additional detail below in association with FIG. 8, a non-volatile memory device includes a first electrode and a fixed magnetic layer disposed above the first electrode. A free magnetic layer is disposed above the fixed magnetic layer, and a second electrode is disposed above the free magnetic layer. A dielectric layer is disposed between the free magnetic layer and the fixed magnetic layer. One or both of the free magnetic layer and the fixed magnetic layer includes a half-metal material at an interface with the dielectric layer. The non-volatile memory device also includes a transistor electrically connected to the free magnetic layer electrode, a source line, and a word line. In one embodiment, the non-volatile memory device further includes an anti-ferromagnetic layer disposed between the fixed magnetic layer and the first electrode.

In certain aspects and at least some embodiments of the present invention, certain terms hold certain definable meanings. For example, a "free" magnetic layer is a magnetic layer storing a computational variable. A "fixed" magnetic layer is a magnetic layer with permanent magnetization. A tunneling barrier, such as a tunneling dielectric or tunneling oxide, is one located between free and fixed magnetic layers. A fixed magnetic layer may be patterned to create inputs and outputs to an associated circuit. Magnetization may be written by spin transfer torque effect while passing a current through the input electrodes. Magnetization may be read via the tunneling magneto-resistance effect while applying voltage to the output electrodes. In an embodiment, the role of the dielectric layer 108 is to cause a large magneto-resistance. The magneto-resistance is the ratio of the difference between resistances when the two ferromagnetic layers have anti-parallel and parallel magnetization and the resistance of the state with the parallel magnetization.

Referring again to the right-hand side of FIG. 1, the portion 120 of the spin transfer torque element 100 including the free magnetic layer 110, the tunneling barrier layer 108, and the fixed magnetic layer 106 is known as a magnetic tunneling junction. The free magnetic layer 110 and the fixed magnetic layer 106 may be ferromagnetic layers which are able to hold a magnetic field or polarization. However, the fixed magnetic layer 106 is configured to hold the majority spin state (e.g., depicted as spin to the right for planar spin state or spin up for vertical spin state). The tunneling barrier layer 108, which separates the free magnetic layer 110 and the fixed magnetic layer 106, may have a thickness, e.g. a distance between the free magnetic layer 110 and the fixed magnetic layer 106 of about 1 nanometer or less, such that electrons can tunnel there through, if a bias voltage is applied between the free magnetic layer electrode 112 and the fixed magnetic layer electrode 102.

In an embodiment, the MTJ 120 functions essentially as a resistor, where the resistance of an electrical path through the MTJ 120 may exist in two resistive states, either "high" or "low," depending on the direction or orientation of magnetization in the free magnetic layer 110 and in the fixed magnetic layer 106. Referring to FIG. 1, in the case that the spin direction is to the left (minority) in the free magnetic layer 110, a high resistive state exists, wherein direction of magnetization in the free magnetic layer 110 and the fixed magnetic layer 106 are substantially opposed or anti-parallel with one another. This is illustrated with arrows in the free magnetic layer 110 pointing left and in the fixed magnetic layer 106 pointing right. Referring again to FIG. 1, in the case that the spin direction is to the right (majority) in the free magnetic layer 110, a low resistive state exists, wherein direction of magnetization in the free magnetic layer 110 and the fixed magnetic layer 106 are substantially aligned or parallel with one another. This is illustrated with arrows in the free magnetic layer 110 pointing right and in the fixed magnetic layer 106 pointing right. It is understood that the terms "low" and "high" with regard to the resistive state of the MTJ 120 are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

The direction of magnetization in the free magnetic layer 110 may be switched through a process call spin transfer torque ("STT") using a spin-polarized current. An electrical current is generally non-polarized (e.g. consisting of about 50% spin-up and about 50% spin-down electrons). A spin polarized current is one with a greater number of electrons of either spin-up or spin-down, which may be generated by passing a current through the fixed magnetic layer 106. The electrons of the spin polarized current from the fixed magnetic layer 106 tunnel through the tunneling barrier or dielectric layer 108 and transfers its spin angular momentum to the free magnetic layer 110, wherein the free magnetic layer 110 will orient its magnetic direction from anti-parallel to that of the fixed magnetic layer 106 or parallel. The free magnetic layer 110 may be returned to its original orientation by reversing the current.

Thus, the MTJ 120 may store a single bit of information ("0" or "1") by its state of magnetization. The information stored in the MTJ 120 is sensed by driving a current through the MTJ 120. The free magnetic layer 110 does not require power to retain its magnetic orientations. As such, the state of the MTJ 120 is preserved when power to the device is removed. Therefore, a spin transfer torque memory bit cell composed of the stack 100 of FIG. 1 is, in an embodiment, non-volatile.

Although the method of fabricating the stack of layers 100 for, e.g., a spin transfer torque memory bit cell has not been described herein, it is understood that the steps for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other associated action with microelectronic component fabrication.

In another aspect, a reading or writing operation may be performed on a memory element including an MTJ with a half-metal layer. FIG. 2A illustrates a plot 200A of energy (E) as a function of density of states (DOS) for a magnetic layer not including a half-metal material. FIG. 2B illustrates plots 200B and 200C of energy (E) as a function of density of states (DOS) for a fixed magnetic layer including a half-metal material and for a free magnetic layer including a half-metal material, respectively, and a reading operation of an MTJ including the layers, in accordance with an embodiment of the present invention.

Referring to FIG. 2A, at the Fermi energy level (EF), a magnetic layer not including a half-metal material includes both majority spin (spin up) and minority spin (spin down) states. By contrast, referring to FIG. 2B, in both the fixed magnetic material including a half-metal material and the free magnetic material including a half-metal material, only (or at least essentially all) of the spin states are majority (spin up) spin states at the Fermi energy level.

In MTJs, high and low resistance states occur when spins in free and fixed magnetic layers are anti-parallel and parallel, respectively. High resistance can be referred to as RAP, while low resistance can be referred to as RP. Referring again to FIG. 2B, regarding reading a MTJ where both the fixed magnetic material includes a half-metal material and the free magnetic material includes a half-metal material, half metals have a split in conduction bands between up and down spins. Hence, there are electrons with only one spin orientation at the Fermi level. RAP is increased since there are, ideally, no available states to tunnel into. Increased RAP results in a larger resistance difference ($\Delta R$) between anti-parallel and parallel states (e.g., since $\Delta R=RAP-RP$). This increased $\Delta R$ can enhance reading 202 of an MTJ.

However, FIG. 3 illustrates plots 300A and 300B of energy (E) as a function of density of states (DOS) for a fixed magnetic layer including a half-metal material and for a free magnetic layer including a half-metal material, respectively, and a writing operation of an MTJ including the layers, in accordance with an embodiment of the present invention. Referring to FIG. 3, a difficulty with half-metals may occur in writing 302 to an MTJ where both the fixed magnetic material includes a half-metal material and the free magnetic material includes a half-metal material. When switching from anti-parallel to parallel resistance, the MTJ is biased as shown in FIG. 3. A concern may be that high resistance in ideal half-metals (e.g. Heusler alloys) results in large voltages during write, which can exceed breakdown criteria of an intervening dielectric layer (e.g., of an intervening MgO layer).

Furthermore, FIG. 4 illustrates plots 400A and 400B of energy (E) as a function of density of states (DOS) for a fixed magnetic layer including a half-metal material and for a free magnetic layer including a half-metal material, respectively, and a switching operation of an MTJ including the layers, in accordance with an embodiment of the present invention. Referring to FIG. 4, there may be an issue with switching 402 from parallel to anti-parallel resistance. For example, switching from parallel to anti-parallel resistance requires reflection of minority spin from an intervening dielectric layer back to a free magnetic layer. The associated spin transfer torque effect is suppressed since there are, ideally, no minority spins in a true half-metal material. Such issues may also be associated with "less-than-ideal" half-metals, where the split in conduction band is smaller. Traps or thermal activation may result in some states to tunnel into as well as the existence of minority spin for switching. But the trend of higher write voltage and current may still persist when half-metal materials are included in both the fixed magnetic layer and the free magnetic layer.

Figure 5:
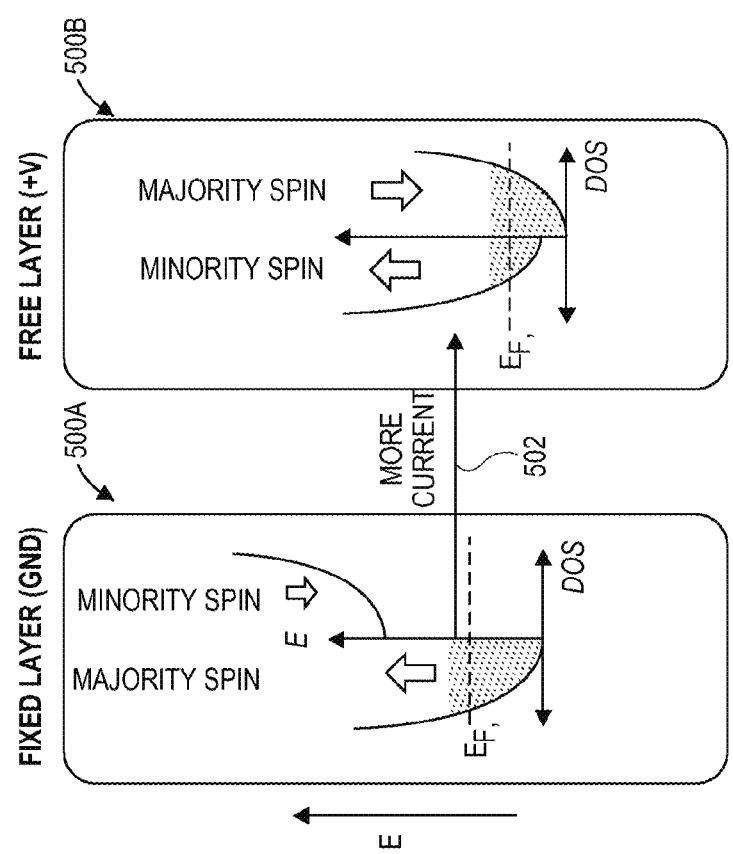
FIG. 5 illustrates plots of energy (E) as a function of density of states (DOS) for a fixed magnetic layer including a half-metal material and for a free magnetic layer including only conventional ferromagnetic material, respectively, and a switching operation of an MTJ including the layers, in accordance with an embodiment of the present invention.

To address the above noted potential issues, FIG. 5 illustrates plots 500A and 500B of energy (E) as a function of density of states (DOS) for a fixed magnetic layer including a half-metal material and for a free magnetic layer including only conventional ferromagnetic material, respectively, and a switching operation of an MTJ including the layers, in accordance with an embodiment of the present invention. Referring to FIG. 5, a half-metal in the free magnetic layer is replaced with a conventional ferromagnet where polarization is less than 1. The resulting energy band diagram for switching 502 from anti-parallel to parallel resistance is shown. Vacant states in ferromagnets enable reduction of RAP during write and accommodate lower write voltages in the arrangement of the MTJ of FIG. 5.

Accordingly, FIG. 6 illustrates plots 600A and 600B of energy (E) as a function of density of states (DOS) for a fixed magnetic layer including a half-metal material and for a free magnetic layer including only conventional ferromagnetic material, respectively, and a writing operation of an MTJ including the layers, in accordance with an embodiment of the present invention. Referring to FIG. 6, for writing 602 from parallel to anti-parallel resistance, minority spins exist in the ferromagnet free magnetic layer (since polarization is less than 1). The existence of such spins supplies minority spins which reflect back into free magnetic layer for switching, as depicted in FIG. 6.

Figure 7:
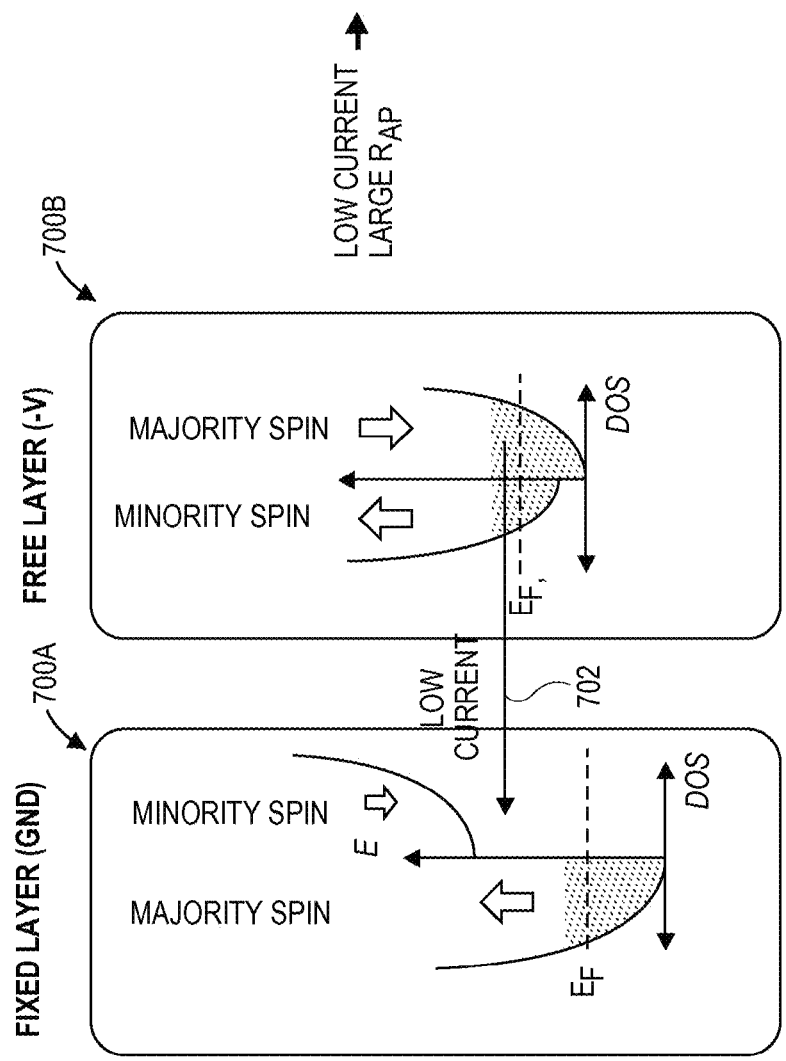
FIG. 7 illustrates plots of energy (E) as a function of density of states (DOS) for a fixed magnetic layer including a half-metal material and for a free magnetic layer including only conventional ferromagnetic material, respectively, and a reading operation of an MTJ including the layers, in accordance with an embodiment of the present invention.

FIG. 7 illustrates plots 700A and 700B of energy (E) as a function of density of states (DOS) for a fixed magnetic layer including a half-metal material and for a free magnetic layer including only conventional ferromagnetic material, respectively, and a reading operation of an MTJ including the layers, in accordance with an embodiment of the present invention. Referring to FIG. 7, the above approaches may enable writing at modest current and voltage, as compared to a case where both free and fixed magnetic layers include ideal half-metals. Furthermore, the advantage of larger $\Delta R$ may still be realized by reading 702 under $-V$.

Thus, in an embodiment, a method of reading a MTJ, e.g., as included in a non-volatile memory device, includes grounding a first electrode having disposed there above a fixed magnetic layer, a free magnetic layer disposed above the fixed magnetic layer, and a dielectric layer disposed between the free magnetic layer and the fixed magnetic layer. The fixed magnetic layer includes a half-metal material at the interface with the dielectric layer. The method further includes negatively biasing a second electrode disposed above the free magnetic layer. The resistance of a current that passes through the free magnetic layer, the dielectric layer, and the fixed magnetic layer upon negatively biasing the second electrode is then measured. In one such embodiment, negatively biasing the second electrode includes biasing with a transistor coupled to the second electrode. In another embodiment, measuring the resistance of the current includes measuring the resistance of a current that passes through a ferromagnetic metal alloy based on a Heusler phase.

As described above, a stack of layers including magnetic material layers and half-metal material layers, e.g., which form a magnetic tunneling junction, may be used to fabricate as memory bit cell. For example, FIG. 8 illustrates a schematic of a spin transfer torque memory bit cell 800 which includes a spin transfer torque element 810, in accordance with an embodiment of the present invention.

Figure 8:
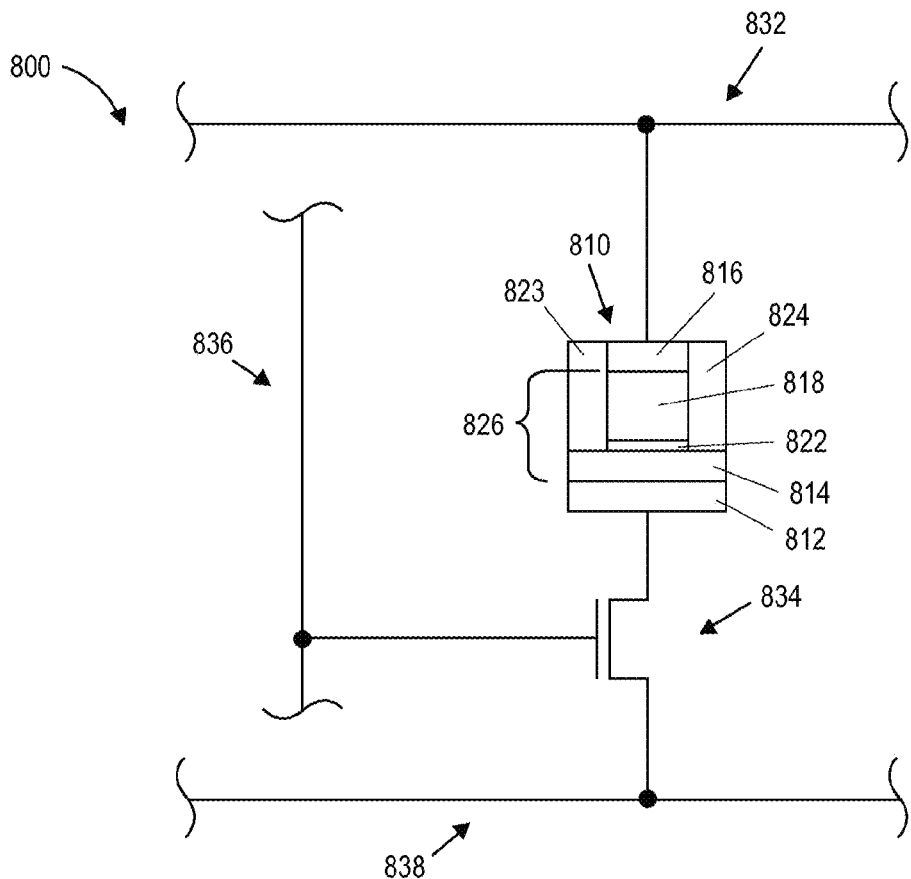
FIG. 8 illustrates a schematic of a spin transfer torque memory bit cell which includes a spin transfer torque element, in accordance with an embodiment of the present invention.

Referring to FIG. 8, the spin transfer torque element 810 may include a free magnetic layer electrode 812 with a free magnetic layer 814 adjacent the free magnetic layer electrode 812, a fixed magnetic layer electrode 816 adjacent a fixed magnetic layer 818, and a tunneling barrier or dielectric layer 822 disposed between the free magnetic layer 814 and the fixed magnetic layer 818. In an embodiment, one or both of the free magnetic layer 814 and the fixed magnetic layer 818 includes a half-metal material.

A first dielectric element 823 and a second dielectric element 824 may be formed adjacent the fixed magnetic layer electrode 816, the fixed magnetic layer 818, and the tunneling barrier or dielectric layer 822. The fixed magnetic layer electrode 816 may be electrically connected to a bit line 832. The free magnetic layer electrode 812 may be connected to a transistor 834. The transistor 834 may be connected to a word line 836 and a source line 838 in a manner that will be understood to those skilled in the art. The spin transfer torque memory bit cell 800 may further include additional read and write circuitry (not shown), a sense amplifier (not shown), a bit line reference (not shown), and the like, as will be understood by those skilled in the art, for the operation of the spin transfer torque memory bit cell 800. It is to be understood that a plurality of the spin transfer torque memory bit cells 800 may be operably connected to one another to form a memory array (not shown), wherein the memory array can be incorporated into a non-volatile memory device. It is to be understood that the transistor 834 may be connected to the fixed magnetic layer electrode 816 or the free magnetic layer electrode 812, although only the latter is shown.

Figure 9:
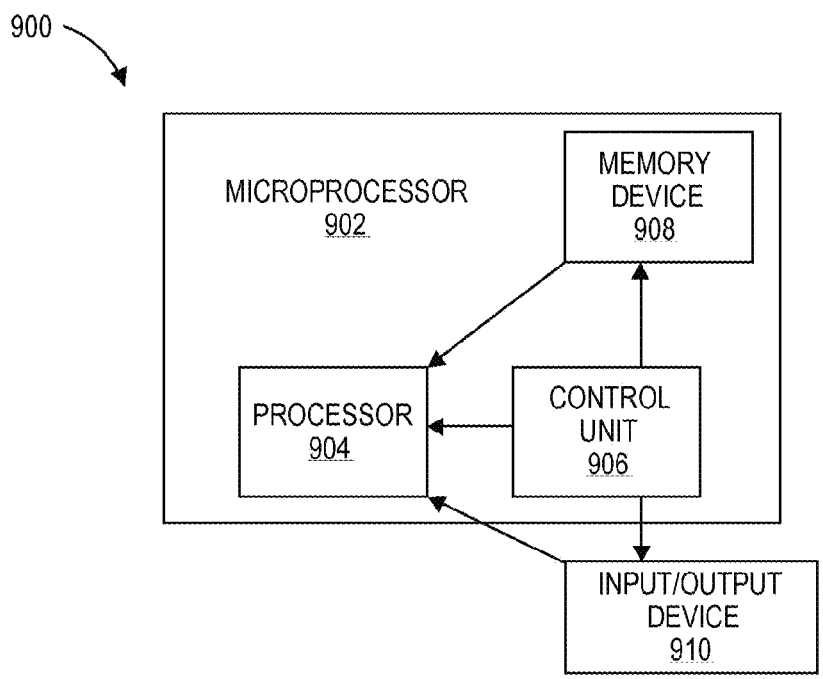
FIG. 9 illustrates a block diagram of an electronic system, in accordance with an embodiment of the present invention.

FIG. 9 illustrates a block diagram of an electronic system 900, in accordance with an embodiment of the present invention. The electronic system 900 can correspond to, for example, a portable system, a computer system, a process control system, or any other system that utilizes a processor and an associated memory. The electronic system 900 may include a microprocessor 902 (having a processor 904 and control unit 906), a memory device 908, and an input/output device 910 (it is to be understood that the electronic system 900 may have a plurality of processors, control units, memory device units and/or input/output devices in various embodiments). In one embodiment, the electronic system 900 has a set of instructions that define operations which are to be performed on data by the processor 904, as well as, other transactions between the processor 904, the memory device 908, and the input/output device 910. The control unit 906 coordinates the operations of the processor 904, the memory device 908 and the input/output device 910 by cycling through a set of operations that cause instructions to be retrieved from the memory device 908 and executed. The memory device 908 can include a spin transfer torque element as described in the present description. In an embodiment, the memory device 908 is embedded in the microprocessor 902, as depicted in FIG. 9.

Figure 10:
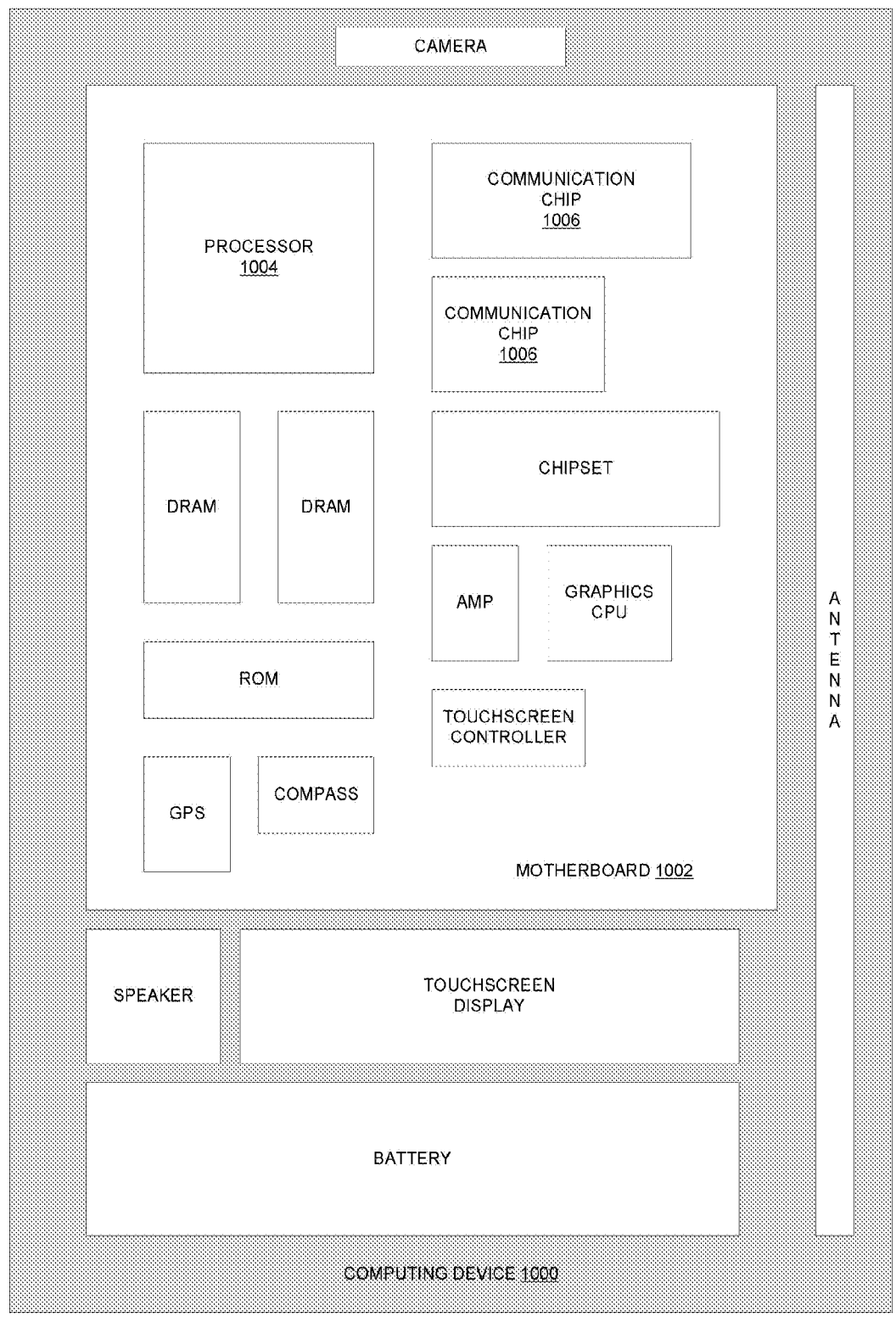
FIG. 10 illustrates a computing device in accordance with one implementation of the invention.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as spin transfer torque memory built in accordance with implementations of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices, such as spin transfer torque memory built in accordance with implementations of the invention.

In further implementations, another component housed within the computing device 1000 may contain an integrated circuit die that includes one or more devices, such as spin transfer torque memory built in accordance with implementations of the invention.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Accordingly, one or more embodiments of the present invention relate generally to the fabrication of microelectronic memory. The microelectronic memory may be non-volatile, wherein the memory can retain stored information even when not powered. One or more, embodiments of the present invention relate to the fabrication of a spin transfer torque memory element for non-volatile microelectronic memory devices. Such an element may be used in an embedded non-volatile memory, either for its non-volatility, or as a replacement for embedded dynamic random access memory (eDRAM). For example, such an element may be used for 1T-1X memory (X=capacitor or resistor) at competitive cell sizes within a given technology node.

Thus, STTM devices with half-metals and methods to write and read the devices have been disclosed. In an embodiment, a magnetic tunneling junction includes a free magnetic layer, a fixed magnetic layer, and a dielectric layer disposed between the free magnetic layer and the fixed magnetic layer. One or both of the free magnetic layer and the fixed magnetic layer includes a half-metal material at an interface with the dielectric layer. In one embodiment, however, only the fixed magnetic layer comprises a half-metal material at the interface with the dielectric layer.

What is claimed is:

1. A magnetic tunneling junction, comprising:
   a free magnetic layer;
   a fixed magnetic layer; and
   a dielectric layer disposed between the free magnetic layer and the fixed magnetic layer, wherein one or both of the free magnetic layer and the fixed magnetic layer comprises a half-metal material at an interface with the dielectric layer, and wherein the half-metal material consists of $Fe_3Si$.

2. The magnetic tunneling junction of claim 1, wherein only the fixed magnetic layer comprises a half-metal material at the interface with the dielectric layer.

3. The magnetic tunneling junction of claim 2, wherein the fixed magnetic layer further comprises a ferroelectric material adjacent the half-metal material, distal from the interface of the fixed magnetic layer with the dielectric layer.

4. The magnetic tunneling junction of claim 2, wherein the free magnetic layer comprises a ferroelectric material.

5. The magnetic tunneling junction of claim 4, wherein the free magnetic layer further comprises a half-metal material adjacent the ferroelectric material, distal from the interface of the free magnetic layer with the dielectric layer.

6. The magnetic tunneling junction of claim 1, wherein the half-metal material is a ferromagnetic metal alloy based on a Heusler phase.

7. The magnetic tunneling junction of claim 1, further comprising an anti-ferromagnetic layer adjacent the fixed magnetic layer, distal from the interface of the fixed magnetic layer with the dielectric layer.

8. A non-volatile memory device, comprising:
   a first electrode;
   a fixed magnetic layer disposed above the first electrode;
   a free magnetic layer disposed above the fixed magnetic layer;
   a second electrode disposed above the free magnetic layer;
   a dielectric layer disposed between the free magnetic layer and the fixed magnetic layer, wherein one or both of the free magnetic layer and the fixed magnetic layer comprises a half-metal material at an interface with the dielectric layer, and wherein the half-metal material is $Fe_3Si$; and
   a transistor electrically connected to the first or the second electrode, a source line, and a word line.

9. The non-volatile memory device of claim 8, wherein the transistor is electrically connected to the first electrode, the source line, and the word line.

10. The non-volatile memory device of claim 8, wherein the transistor is electrically connected to the second electrode, the source line, and the word line.

11. The non-volatile memory device of claim 8, further comprising an anti-ferromagnetic layer disposed between the fixed magnetic layer and the first electrode.

12. The non-volatile memory device of claim 8, wherein only the fixed magnetic layer comprises a half-metal material at the interface with the dielectric layer.

13. The non-volatile memory device of claim 12, wherein the fixed magnetic layer further comprises a ferroelectric material disposed between the half-metal material and the first electrode, distal from the interface of the fixed magnetic layer with the dielectric layer.

14. The non-volatile memory device of claim 12, wherein the free magnetic layer comprises a ferroelectric material.

15. The non-volatile memory device of claim 14, wherein the free magnetic layer further comprises a half-metal material disposed between the ferroelectric material and the second electrode, distal from the interface of the free magnetic layer with the dielectric layer.

16. The non-volatile memory device of claim 8, wherein the half-metal material is a ferromagnetic metal alloy based on a Heusler phase.

17. A magnetic tunneling junction, comprising:
a free magnetic layer;
a fixed magnetic layer; and
a dielectric layer disposed between the free magnetic layer and the fixed magnetic layer, wherein one or both of the free magnetic layer and the fixed magnetic layer comprises a half-metal material at an interface with the dielectric layer, and wherein the half-metal material comprises $Fe_3Si$.

18. The magnetic tunneling junction of claim 17, wherein only the fixed magnetic layer comprises a half-metal material at the interface with the dielectric layer.

19. The magnetic tunneling junction of claim 18, wherein the fixed magnetic layer further comprises a ferroelectric material adjacent the half-metal material, distal from the interface of the fixed magnetic layer with the dielectric layer.

20. The magnetic tunneling junction of claim 18, wherein the free magnetic layer comprises a ferroelectric material.

21. The magnetic tunneling junction of claim 20, wherein the free magnetic layer further comprises a half-metal material adjacent the ferroelectric material, distal from the interface of the free magnetic layer with the dielectric layer.

22. The magnetic tunneling junction of claim 17, wherein the half-metal material is a ferromagnetic metal alloy based on a Heusler phase.

23. The magnetic tunneling junction of claim 17, further comprising
an anti-ferromagnetic layer adjacent the fixed magnetic layer, distal from the interface of the fixed magnetic layer with the dielectric layer.

* * * * *